United States Patent
Casey et al.

(10) Patent No.: US 7,015,581 B2
(45) Date of Patent: Mar. 21, 2006

(54) LOW-K DIELECTRIC MATERIAL SYSTEM FOR IC APPLICATION

(75) Inventors: Jon A. Casey, Poughkeepsie, NY (US); Daniel C. Edelstein, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 36 days.

(21) Appl. No.: 11/037,995

(22) Filed: Jan. 18, 2005

(65) Prior Publication Data

US 2005/0200025 A1    Sep. 15, 2005

Related U.S. Application Data

(62) Division of application No. 10/719,704, filed on Nov. 21, 2003, now Pat. No. 6,878,616.

(51) Int. Cl.
*H01L 23/48* (2006.01)
*H01L 21/4763* (2006.01)

(52) U.S. Cl. .................. 257/750; 257/758; 257/759; 257/760; 438/623; 438/634; 438/637

(58) Field of Classification Search ................ 438/623, 438/634, 637–640; 257/750, 758, 759, 760
See application file for complete search history.

(56) References Cited

U.S. PATENT DOCUMENTS

| | | | |
|---|---|---|---|
| 3,758,284 A | 9/1973 | Haller | |
| 3,792,987 A | 2/1974 | Eaton | |
| 3,843,341 A | 10/1974 | Hammel et al. | |
| 4,933,307 A | 6/1990 | Marshall et al. | |
| 5,846,278 A | 12/1998 | Jantzen et al. | |
| 6,027,796 A | 2/2000 | Kondoh et al. | |
| 6,358,842 B1 * | 3/2002 | Zhou et al. | 438/633 |
| 6,444,268 B1 | 9/2002 | Lefkowitz et al. | |
| 6,551,656 B1 | 4/2003 | Clough | |
| 2003/0211728 A1 * | 11/2003 | Mandal | 438/633 |
| 2004/0029303 A1 | 2/2004 | Hart et al. | |

* cited by examiner

*Primary Examiner*—Hsien-Ming Lee
(74) *Attorney, Agent, or Firm*—Scully, Scott, Murphy & Presser; Margaret A. Pepper, Esq.

(57) ABSTRACT

A low-k dielectric for use as an interlayer for an interconnect structure is provided. The dielectric of the present invention is an alkaline boron silicate glass which when formulated in certain compositional ranges can undergo spinodal decomposition when processed using certain thermal profiles. Spinodal decomposition is a chemical and physical separation of the silicate glass into a distinct interpenetrating microstructure which contains a substantially pure silicon dioxide network and a boron-rich network. The dimension (i.e., scale), and the amount of separation can be controlled through compositional and thermal control during the processing of the silicate glass.

9 Claims, 3 Drawing Sheets

LOW-K DIELECTRIC MATERIAL SYSTEM FOR IC APPLICATION

This application is a divisional of U.S. application Ser. No. 10/719,704, filed Nov. 21, 2003 now U.S. Pat. No. 6,878,616.

FIELD OF THE INVENTION

The present invention relates to an interconnect structure for high-speed microprocessors, application specific integrated circuits (ASICs), and other high-speed integrated circuits (ICs). More specifically, the present invention provides an interconnect structure that includes a low dielectric constant controlled pore glass material as the interlayer dielectric of the structure.

BACKGROUND OF THE INVENTION

Lowering the dielectric constant of interlayer dielectric (ILD) materials for on-chip semiconductor interconnect structures is required to improve the performance for the next generation of integrated circuit (IC) devices. Historically, dense metal oxides such as, for example, silicon dioxide ($SiO_2$), have been used as the ILD material in interconnect structures. While $SiO_2$ is an excellent insulator with high modulus and hardness, and has a coefficient of thermal expansion (CTE) close to silicon, the dielectric constant (k) is approximately 4.0, which is too high for advanced generation interconnects. High-dielectric constants for ILD materials result in signal charging and propagation delays as well as increased transistor power budgets in the circuits that make up the IC. These circuit delays and power requirements are now the major issues relative to improving the performance of IC chips. As such, lowering the dielectric constant of the ILD material used for IC fabrication is a very important pursuit in current research and development.

Numerous "low-k" (k<4.0) materials have been developed and have been investigated for use as the ILD materials in interconnect structures. The lowest dielectric constants for fully dense dielectric materials typically are in the range of 2.7 to 3.3. To achieve dielectric constants significantly below 3.0 typically involves shifting from silicate to organic polymer materials, fluorination or methylation to lower dielectric polariziability, and/or lower the density of the insulator material such as by incorporation of controlled pores or voids into the insulator material. This latter approach, when applied to silicate or organosilicate materials, tends to produce elastically stronger but more brittle dielectric materials than the organic polymer analogs. The dielectric strength as well tends to be higher for the silicate-based materials. The higher the void volume in the dielectric material, the lower the dielectric constant. Unfortunately, as the void volume in the dielectric material increases, the mechanical properties of the dielectric material tend to degrade continuously. Ideally, one would like to introduce a very high level of void volume while maintaining good mechanical properties. Additionally, one would like to use an ILD material that has a CTE close to that of silicon. Since the mismatch in the CTE between the ILD and silicon chip is a primary mechanism for stress formation in the structure, the closer the CTE match between the ILD and silicon, the lower will be the stress introduced into the IC during thermal processing and use.

To achieve the required low-dielectric constant, high strength as well as closely match CTE, the incorporation of a controlled void volume into silicon dioxide would be ideal. The formation of controlled voids in silicon dioxide would require the introduction of a porogen material into silicon dioxide. Porogens are typically shaped organic molecules that are added to a system, and then thermally removed after the matrix is frozen to leave a void or pore. One problem associated with porogen inclusion into a matrix is that the porogen is typically very difficult to mix homogeneously in high volume into the dielectric matrix. As the required pore volume increases, the porogen and subsequent pore volume becomes inhomogenous due to such processes as agglomeration, precipitation, or coalescence. This can lead to "killer pores" that promote extrinsic failure at less stress conditions, such as low-field dielectric breakdown, and can render the dielectric material unusable in a high volume semiconductor application. In addition, these inhomogeneities can seriously degrade the mechanical properties of the porous dielectric. As such, porogen additions may not be the ideal methodology for the formation of low-k ILD materials.

In view of the drawbacks with prior art ILD materials, there is a continued need for providing new and improved ILD materials that have a dielectric constant that is lower than 4.0, yet are of high strength and have a CTE that closely matches that of silicon. Such ILD materials should be made without the use of a porogen so as to avoid the problems mentioned in the previous paragraph.

SUMMARY OF THE INVENTION

The present invention provides an ILD material that has a low-dielectric constant of less than 4.0, preferably less than 2.7, a high strength (elastic modulus on the order of about 5 GPa or above, preferably about 9 GPa or above) and a CTE that closely matches that of silicon.

The ILD material of the present invention is an alkaline borosilicate glass (also referred to as a 'controlled pore glass' CPG)) which when formulated in certain compositional ranges can undergo spinodal decomposition when processed using certain thermal profiles. Spinodal decomposition is a chemical and physical separation of the CPG into a distinct interpenetrating microstructure which contains a substantially pure silicon dioxide network and a boron-rich network. The dimension (i.e., scale), and the amount of separation can be controlled through compositional and thermal control during the processing of the CPG.

It should be noted that the controlled pore glasses themselves are not novel materials since the same have been used for many years for applications in liquid chromatography (LC) and filters. The applicants however are unaware of any prior art that discloses that such CPG materials can be used as an ILD material for applications in semiconductor interconnect structures.

One key feature of CPG materials is that the solubility of the boron-rich network and the silicon dioxide network are very dissimilar. For example, the silicon dioxide network is insoluble in most acids excluding hydrofluoric (HF) acid, while boron-rich material is soluble in most common inorganic acids. As such, the CPG material, after undergoing spinodal decomposition, can be acid washed to dissolve the boron-rich material, resulting in a reticulated porous network of substantially pure, amorphous silicon dioxide. The term "substantially pure" when used in conjunction with the resultant amorphous silicon dioxide denotes that the remaining porous silicon dioxide contains low levels of alkali, boron and acid complexes or other impurities therein.

Void volumes as high as 70 volume percent can be achieved using this class of material. Preferably, the void volumes achieved in the present invention are from about 20 to about 70% (maintains closed porosity). Moreover, the dielectric constant of this class of material, which decreases with increasing void volume, is below 4.0, preferably below 2.7.

Pore size can also be controlled through the initial CPG composition as well as the thermal treatment utilized during thermal decomposition. Average pore sizes of less than 75 Å, preferably less than 50 Å, can be achieved in the present invention. The pore structure of the resultant material after acid washing is an open pore network since it is formed through a dissolution process. As such, the pores form a continuous three-dimensional network interpenetrating a similar network of amorphous silica.

The use of the porous CPG material for an ILD requires some additional processing to ensure that the acid etching of the boron-rich material does not damage the metallurgy contained within the IC. Hence, the use of the porous-CPG material does not represent a simple substitution which can be implemented into all interconnect processing schemes. As indicated, modification of the interconnect processes are needed to avoid unwanted etching of the IC metallurgy.

The present invention provides a method of integrating the porous CPG material into an interconnect structure such that no damage to the IC metallurgy occurs. Specifically, and in broad terms, the method of the present invention comprises:

forming a dense etch stop layer on a surface of a substrate, said dense etch stop layer is capable of protecting underlying metallurgy during a subsequent etching step;
  forming a CPG interlayer dielectric on the dense etch stop layer;
  subjecting the CPG interlayer dielectric to thermal treatment which allows for spinodal decomposition of the CPG into a distinct interpenetrating microstructure which includes a substantially pure silicon dioxide network and a boron-rich network;
  selectively removing the boron-rich network by acid etching to provide a reticulated porous network of substantially pure, amorphous silicon dioxide; and
  forming metal wiring within said reticulated porous network of substantially pure, amorphous silicon dioxide.

An optional step of surface modification of the reticulated porous network of substantially pure, amorphous silicon dioxide can follow the selective removing step. In this optional embodiment of the present invention, the surface modification reduces the water adsorption/absorption characteristics of the reticulated network by treating the resultant material with a hydrophobic agent such as, for example, a silylating agent.

In other embodiments of the present invention, the walls of the reticulated porous network of substantially pure, amorphous silicon dioxide, which is patterned and etched prior to forming the metal wiring therein, are lined with a refractory liner or the walls are first sealed using a sealant layer and thereafter a refractory liner can be formed atop of the sealed walls.

Another aspect of the present invention relates to an interconnect structure that comprises:

a substrate having a dense etch stop layer located on a surface thereof;
  a patterned interlayer dielectric of a reticulated porous network of substantially pure, amorphous silicon dioxide located on the dense etch stop layer; and
  a metal conductive region formed within said patterned interlayer dielectric.

Due to the pore size of the reticulated porous network of substantially pure, amorphous silicon dioxide, liner coverage may be critical. Hence, plasma surface densification treatments or very thin chemical vapor deposited or atomic layer deposition dielectrics can be added after patterning to seal the pores, and thicker liners can be employed at higher wiring levels of larger dimensions. ICs typically contain multiple layer thickness. For layers that contain larger feature sizes, larger ILD thicknesses are utilized in the present invention. For these layers, the porous glass might be well suited, as detriments of pore-sealing films might be negligible. Thicker ILD layers require high strength and closely matched CTE to that of silicon—key benefits of the CPG material employed in the present invention.

Although pore sizes may be more significant for the lower/smaller levels, there still may be successful application of these films with additional plasma processes to seal the pores prior to metallization or capping. Conformal processes such as atomic layer deposited $SiO_2$ require only 3.5 nm films to pinch off 7.5 nm pores. This film on both sides of the interconnects represents only 7% of the M1 spacing in the 65 nm generation, and would only cause a small marginal increase in total interconnect capacitance. At higher levels, the effect would be more pronounced. The prospects of an all-silicate ultra-low k ILD, without carbon or organic components, might ease processing such as reactive ion etching and justify the added processing for sealing the pores.

The thermal match to silicon might enhance chip package reliability beyond that for even a high modulus material with more thermal mismatch. Finally, the method of the present invention might lead to lower stresses (CTE induced tensile, compressive or sheer) as compared to templated pore decomposition spin-on glass and dual-phase PECVD organosilicate glasses. This could obviate one of the most significant potential failure modes of ultralow-k silicates, which is brittle fracture from tensile driving forces in the film and in structures with multilevel Cu interconnects.

DETAILED DESCRIPTION OF THE INVENTION

Figure 1:
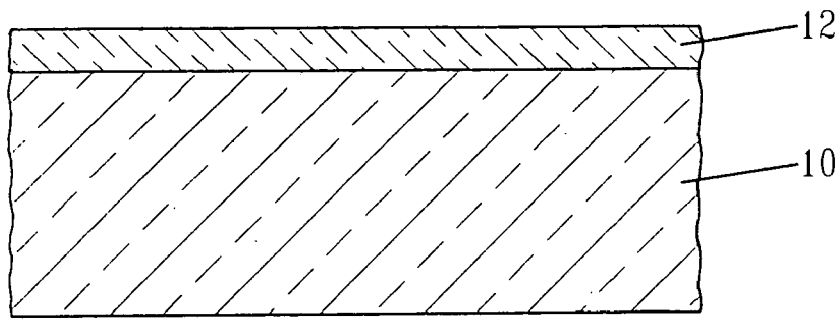
FIG. 1 is a pictorial representation (through a cross sectional view) of an initial structure, which includes a substrate having a dense etch stop layer on a surface thereof, that can be employed in the present invention.

The present invention, which provides a new ILD material for use in semiconductor interconnect structures as well as a method of fabricating such interconnect structures, will now be described in greater detail by referring to the drawings that accompany the present application. It should be noted that the drawings of the present application are not drawn to scale. Moreover, although the drawings of the present invention show only a single metal wiring region within the ILD material, the present invention is not limited to such a structure. Instead, the ILD material of the present invention can contain many wiring regions therein and various wiring levels can be stacked one atop another. The various wiring levels can be interconnected by metal vias using technology well known to those skilled in the interconnect art. A single damascene or dual damascene process can be used in forming the interconnect structure.

Reference is first made to the initial structure that is shown in FIG. 1. Specifically, the initial structure shown in FIG. 1 comprises a substrate 10 and a dense etch stop layer 12 located on a surface of the substrate 10. Substrate 10 employed in the present invention may include any conventional material that is typically present in an interconnect structure. Thus, for example, the substrate 10 may be a dielectric (interlevel or intralevel), a wiring level, a semiconductor wafer or any combinations thereof. When a semiconductor wafer is employed as the substrate, the wafer may include various circuits and/or devices formed thereon.

The dense etch stop layer 12 is formed on a surface of substrate 10 utilizing a conventional deposition process such as, for example, chemical vapor deposition (CVD), plasma-enhanced chemical vapor deposition (PECVD), physical vapor deposition (PVP), atomic layer deposition (ALD), chemical solution deposition, evaporation, spin-on coating and other like deposition processes. The term "dense" when used in conjunction with the phrase "etch stop layer" denotes a density of at least 1.3x and more preferably greater than 1.5x the density of the interlevel dielectric material.

The dense etch stop layer 12 includes any dielectric material that is capable of protecting underlying metallurgy (not shown) that can be present in, or on, the substrate 10 during a subsequent acid etching step that is used in forming the GPC ILD of the present invention. Illustrative examples of suitable dense etch stop layers that can be used in the present invention, include, but are not limited to: silicon dioxide, silicon nitride, hydrogenated silicon carbide, hydrogenated silicon oxycarbide, silicon oxynitride, hydrogenated silicon carbon nitride, or other like dielectrics. Combinations, including multilayers, of these dielectric materials can be used in the present invention as the dense etch stop layer 12.

The thickness of the dense etch stop layer 12, after deposition, may vary depending upon the type of dielectric material used as well as the process in which the dielectric has been deposited. Typically, the dense etch stop layer 12 has a thickness from about 25 to about 100 nm, with a thickness from about 35 to about 70 nm being more typical.

After providing the initial structure shown in FIG. 1, a controlled pore glass (CPG) interlayer dielectric (ILD) is formed on an exposed, upper surface of the dense etch stop layer 12. The CPG ILD is formed utilizing a conventional deposition process such as, for example, CVD or a spin-on technique. The CPG ILD formed at this point of the present invention typically has a thickness from about 100 to about 2000 nm, with a thickness of from about 150 to about 1000 nm being more typical. Compositions for the CPG are typically, but not limited to $R_yO.B_2O_3.SiO_2$ where RYO is an alkaline earth, alkali metal or heavy metal oxide. Illustratively, $R_yO$ can be $Li_2O$, $Na_2O$, CaO, BaO, MgO, BeO, SrO, ZnO, PbO, $K_2O$ or any combination of the above. Y is 1 or 2 depending upon the valence of the metal R. Key to the composition is the formation of an imisibility. Additionally, small amounts of $Al_{2O3}$ (0–4 weight percent) can be included in the composition.

The CPG ILD at this stage of the present invention has a dielectric constant from about 4.0 to about 7.0. The CPG ILD that is formed after deposition does not contain controlled pores or voids therein; therefore further treatment is necessary to provide the controlled pores or voids in the CPG ILD. It is thus emphasized the CPG material after deposition does not represent the final ILD material of the present invention. Instead, the as deposited CPG ILD material represents a starting ILD material that is employed in the present invention as a precursor material for the final ILD material.

As stated above, further treatment is necessary in order to provide controlled pores or voids into the as deposited CPG material. In accordance with the present invention, the starting (i.e., as deposited) CPG material is first subjected to a thermal treatment step that permits spinodal decomposition of the CPG ILD into a distinct microstructure which includes a substantially pure silicon dioxide network and a boron-rich network. The thermal treatment step that can be employed in the present invention is performed at a temperature that is equal to or greater than 350° C. More preferably, the thermal treatment is performed at a temperature from about 400° C. to about 600° C. The thermal treatment step of the present invention is carried out in an inert gas ambient. Illustrative examples of inert gas ambients that can be employed in the present invention include, He, Ar, $N_2$, Ne, Kr, Xe and any combinations thereof. A preferred inert gas ambient employed in the present invention is $N_2$.

The thermal treatment step of the present invention is carried out at a temperature within the aforementioned temperature range for a period of time from about 2 to about 40 hours. More preferably, the thermal treatment step is carried out for a time period from about 5 to about 10 hours. The thermal treatment step may be performed to a single targeted temperature using a single ramp rate, or various ramp-up and soak cycles may be employed wherein the ramp rate may be the same or varied.

After the thermal treatment process which converts the starting CPG ILD into a microstructure including a substantially pure silicon dioxide network and a boron-rich network, the thermally treated CPG ILD material is then subjected to an acid etching process that is capable of selectively removing the boron-rich network from the thermally treated CPG ILD material leaving behind a porous controlled pore glass (CPG) ILD that comprises a reticulated porous network of substantially pure, amorphous silicon dioxide. The term "reticulated" is used in the present invention to denote that the final CPG ILD of the present invention comprises a 3-D interpenetrating network. By "amorphous", it is meant that the silicon dioxide has no real or apparent crystalline form.

The acid etch process of the present invention includes the employment of any inorganic acid that can selectively remove the boron-rich network without substantially removing the silicon dioxide network. Illustrative examples of inorganic acids that can be used in the present invention for selective etching the boron-rich network material from the thermally treated CPG ILD include, but are not limited to: hydrochloric acid, nitric acid, nitrous acid, sulfuric acid, water.

Figure 2:
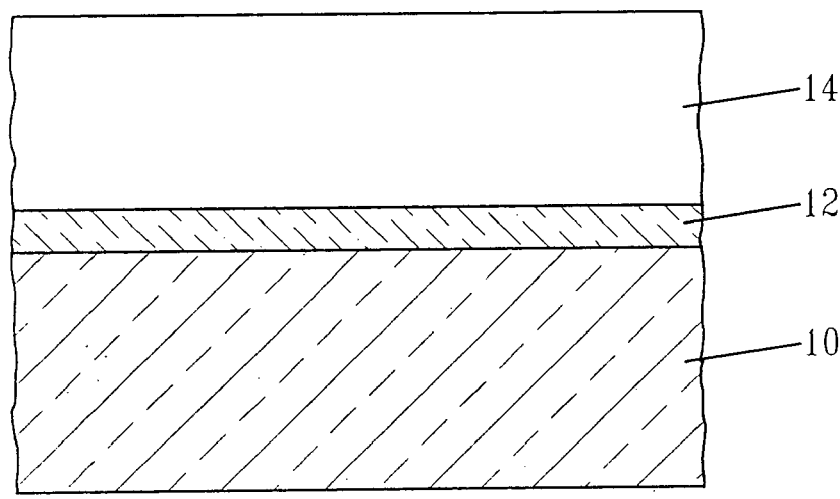
FIG. 2 is a pictorial representation (through a cross sectional view) of the initial structure of FIG. 1 after a reticulated porous network of substantially pure, amorphous silicon dioxide ILD is formed on the dense etch stop layer.

The resultant CPG ILD 14 that is formed after thermal treatment and acid etching is shown in FIG. 2. As stated above, the CPG ILD 14 comprises a reticulated porous network of substantially pure, amorphous silicon dioxide. The CPG ILD 14 of the present invention has a dielectric constant of about 4.0 or less, with a dielectric constant of about 2.7 or less being more typical. The CPG ILD 14 is also characterized having a pore size from about 5 to about 15 nm at a volume percent porosity from about 30 to about 70%. More preferably, the CPG ILD 14 of the present invention has a pore size from about 5 to about 10 nm at a volume percent porosity from about 40 to about 60%.

In one embodiment of the present invention, it is possible to subject the CPG ILD 14 to a surface modification process which reduces the water absorption/absorption characteristics of the reticulated network. When surface modification is employed, the CPG ILD 14 is treated with a hydrophobic agent such as a silylating agent, for example HMDS (hexylmethyl disilane) or TMAH.

Figure 3:
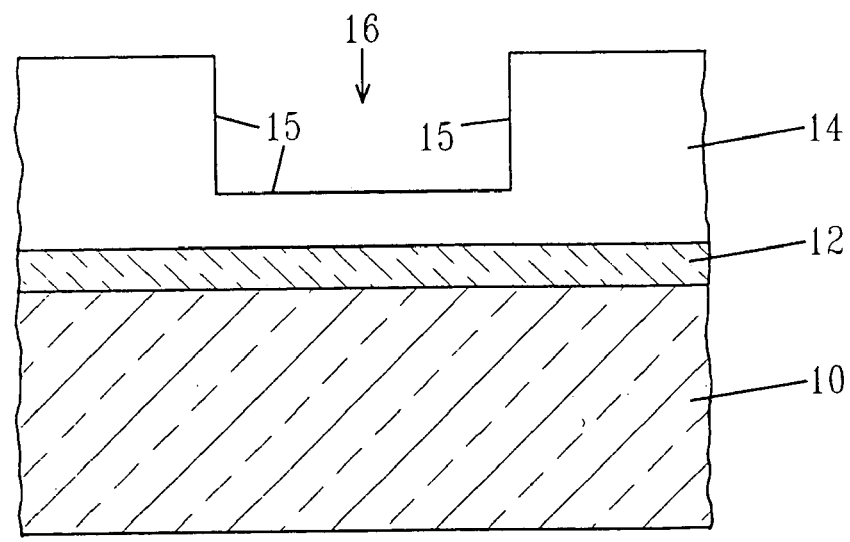
FIG. 3 is pictorial representation (through a cross sectional view) of the structure of FIG. 2 after patterning the ILD.

After forming the CPG ILD 14, the CPG ILD 14 is patterned by conventional lithography and etching to provide one or more openings 16 in the CPG ILD 14. An example of a structure including the patterned CPG ILD 14 is shown, for example, in FIG. 3. The lithography step includes applying a photoresist to the surface of the CPG ILD 14, exposing the applied photoresist to a pattern of radiation and developing the exposed photoresist utilizing a conventional resist developer. The lithography step provides a patterned photoresist (not shown) to the surface of the CPG ILD 14 that protects portions of the underlying CPG ILD 14, while leaving at least one other portion of the CPG ILD 14 exposed. The at least one exposed portion of the CPG ILD 14 is then etched utilizing a dry etching process such as, for example, reactive-ion etching, ion beam etching, plasma etching and/or laser ablation. Following this etching step, the patterned photoresist is typically removed from the structure utilizing a conventional resist stripping process well known to those skilled in the art. Further patterning may be performed at this point of the present invention, if so desired.

The patterning step provides at least one opening 16 in the CPG ILD 14. The at least one opening 16 may be a via opening, a line opening or a combination thereof. In the drawings, opening 16 is illustrated as a line opening. Depending on the type of opening formed, the at least one opening 16 may extend entirely through the CPG ILD 14 or it may stop within the CPG ILD 14 itself. The at least one opening 16 has exposed walls 15 that may remain bare or can be lined with various materials depending on the type of interconnect structure formed. The various materials that can be used in the present invention to line the walls of the patterned CPG ILD 14 will be discussed in greater detail hereinbelow with reference to FIGS. 6 and 7.

Figure 4:
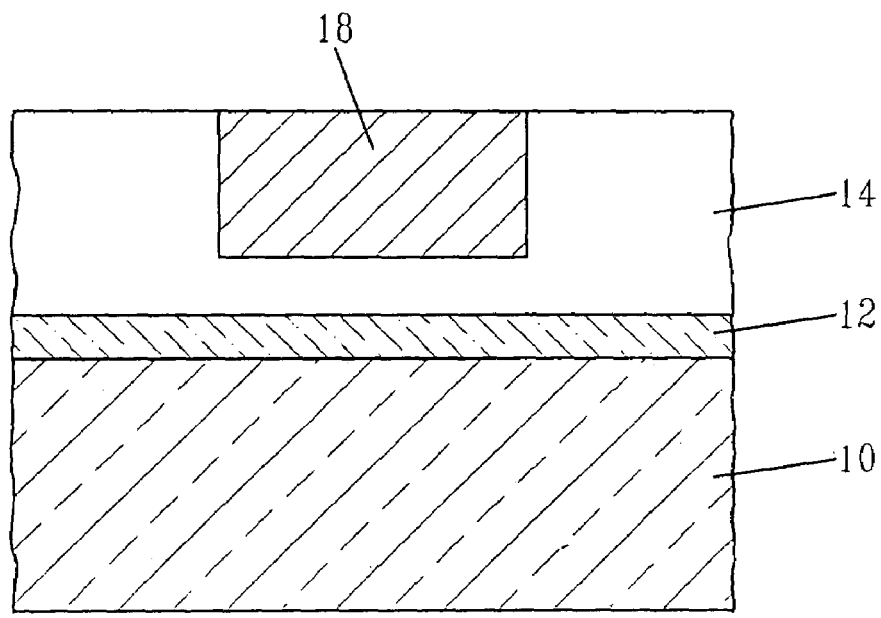
FIG. 4 is a pictorial-representation (through a cross sectional view) of the structure of FIG. 3 after a conductive wiring region is formed in the patterned area of the ILD.

Following the patterning of the CPG ILD 14, the at least one opening 16 is typically lined with a refractory liner (to be discusses in greater detail below) and then filled with a conductive metal and planarized so as to provide the structure shown in FIG. 4. The refractory liner is not shown in FIG. 4 for clarity but it is generally present in the at least one opening 16 prior to filling with conductive metal. In FIG. 4, reference number 18 refers to a metal conductive region, which may simply be referred to as metal wire 18. The term "conductive metal" is used herein to denote a metal selected from the group consisting of aluminum (Al), copper (Cu), tungsten (W), silver (Ag) and other like metals which are typically used in interconnect structures. Alloys of these conductive metals such as Al-Cu are also contemplated herein. A preferred metal used in the present invention is copper. The metal is formed in the at least one opening 16 utilizing a conventional deposition process such as, for example, electrolyptic plating or other solution deposition, chemical vapor deposition (CVD), plasma-assisted CVD, plating, sputtering, and other like deposition processes.

After lining the opening with refractory liner and then filling the at least one opening 16 with a conductive metal, the structure is typically subjected to a conventional planarization process such as chemical-mechanical polishing (CMP) or grinding which removes any conductive metal formed above the CPG ILD 14.

Figure 5:
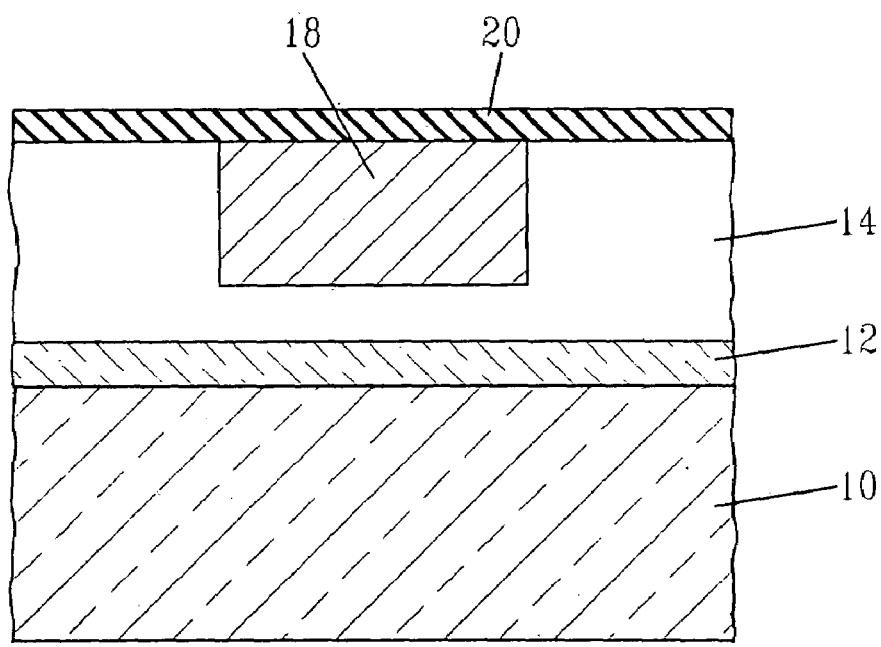
FIG. 5 is a pictorial representation (through a cross sectional view) of a structure of the present invention wherein the upper surface of the structure shown in FIG. 4 includes a capping layer.

Next, a capping layer 20 is formed on the upper surfaces of the structure shown in FIG. 4, including the upper surface of the CPG ILD 14 and the metal wiring 18 providing the structure shown in FIG. 5. The capping layer 20 is comprised of any barrier layer including, for example, SiN, SiCN, SiC, SiCOH, $SiO_2$, SiON, and combinations thereof, including multilayers. The capping layer 20 can be formed utilizing a conventional deposition process including any of those mentioned above in connection with the dense etch stop layer 12. Preferably, the capping layer 20 is formed by a PECVD process.

The thickness of the capping layer 20 may vary depending on the type of material employed as well as the technique used for depositing the same. Typically, the thickness of the capping layer 20 is from about 25 to about 100 nm, with a thickness from about 35 to about 70 nm being more typical.

At this point of the present invention, another ILD layer, including another GPG ILD of the present invention, can be formed and the above processing steps may be repeated to form a multilevel interconnect structure.

Figure 6:
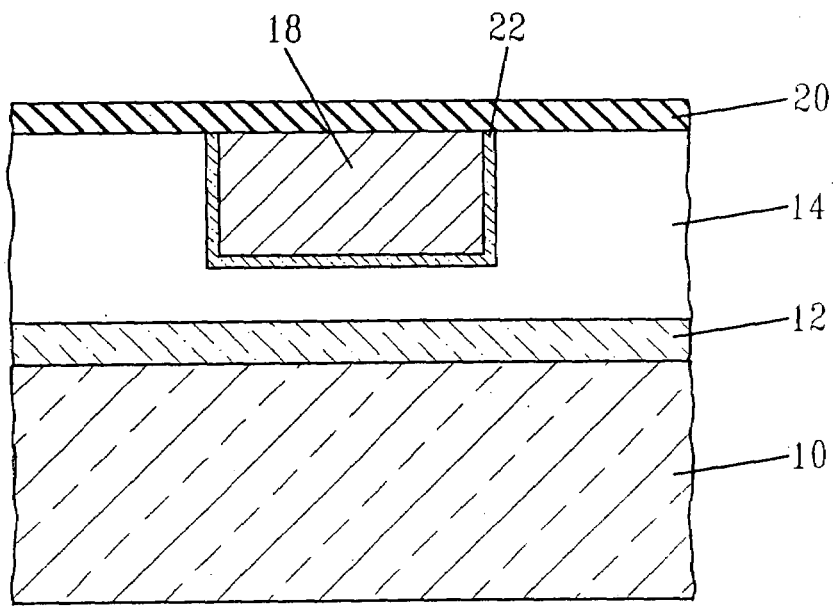
FIG. 6 is a pictorial representation (through a cross sectional view) of an optional fat line structure of the present invention wherein the walls of the patterned ILD include a refractory liner.

FIG. 6 shows an optional embodiment of the present invention in which a refractory liner 22 is employed for a fat line interconnect structure. The refractory liner 22, which lines walls 15, serves as a pore sealant in this embodiment of the present invention. The refractory liner 22 employed in the present invention includes any material that prevents the diffusion of the conductive metal into the CPG ILD 14. Some examples of such liners include, but are not limited to: TiN, TaN, Ti, Ta, W, WN, TaN/Ta and other like materials including combinations thereof. The liner material may be formed in the at least one opening 16 in the CPG ILD 14 utilizing a conventional deposition process well known to those skilled in the art, including: CVD, PECVD, ALD, PVD, plating and chemical solution deposition.

The thickness of the optional refractory liner 22 may vary depending on the liner material as well as the method used in forming the same. Typically, refractory liner 22 has a thickness from about 10 to about 100 nm, with a thickness from about 20 to about 50 nm being more typical.

Figure 7:
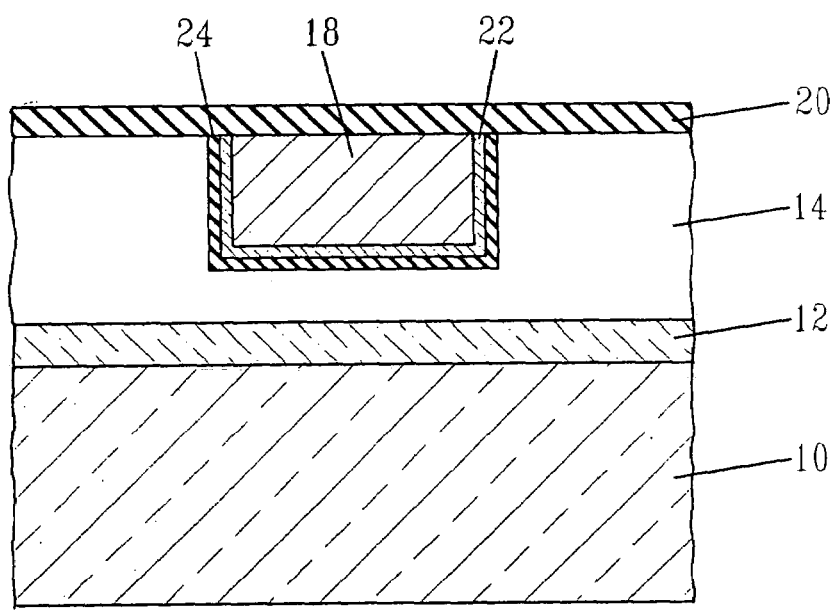
FIG. 7 is a pictorial representation (through a cross sectional view) of an optional thin line structure of the present invention wherein the walls of the patterned ILD are sealed by a pore plasma sealant and a refractory liner is formed atop the pore plasma sealant.

Another possible embodiment of the present invention is to form a sealing layer 24 such as SiN, SiCN, SiC, SiCOH, $SiO_2$, SiON and the like, including combinations thereof on the walls 15. The sealant layer 24 may be used in conjunction with refractory liner 22. FIG. 7 shows an example of such a structure (i.e., thin line interconnect structure) including a sealant layer 24 and a refractory liner 22. The sealant layer 24 may be formed in the at least one opening 16 in the CPG ILD 14 utilizing a conventional deposition process well known to those skilled in the art, including: CVD, PECVD, ALD, PVD, plating and chemical solution deposition. Alternatively, the sealant layer may be formed by exposing the patterned structure to a plasma such as $N_2$, $O_2$, $N_2/H_2$ to react and grow the surface of the GPC ILD 14. The sealant layer 24 is used to pinch off the open pores in the patterned CPG ILD 14.

The thickness of the sealant layer 24 may vary depending on the material employed in sealing the pores as well as the method used in forming the same. Typically, sealant layer 24 has a thickness from about 2 to about 50 nm, with a thickness from about 5 to about 20 nm being more typical.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. An interconnect structure comprising:
   a substrate having a dense etch stop layer located on a surface thereof;
   a patterned interlayer dielectric of a reticulated porous network of substantially pure, amorphous silicon dioxide located on the dense etch stop layer; and
   a metal conductive region formed within said patterned interlayer dielectric.

2. The interconnect structure of claim 1 wherein the dense etch stop layer is a dielectric material that prevents acid from attacking underlying metallurgy present in the substrate.

3. The interconnect structure of claim 2 wherein said dense etch stop layer comprises silicon dioxide, silicon nitride, silicon oxynitride, hydrogenated silicon carbide, hydrogenated silicon oxycarbide, or hydrogenated silicon carbon nitride.

4. The interconnect structure of claim 1 wherein said patterned interlayer dielectric is a controlled pore glass material having a dielectric constant of less than 4.0.

5. The interconnect structure of claim 4 wherein said controlled pore glass material has a pore size from about 5 to about 15 nm at a volume percent porosity from about 30 to about 70%.

6. The interconnect structure of claim 1 wherein said patterned interlayer dielectric has a surface that is hydrophobic.

7. The interconnect structure of claim 1 wherein said metal conductive region includes a conductive metal selected from the group consisting of Al, Cu, W, Ag and alloys thereof.

8. The inter connect structure of claim 7 wherein said conductive metal is Cu.

9. The interconnect structure of claim 1 wherein said metal conductive region further comprises a refractory liner, sealant layer or combination thereof.

* * * * *